US005606199A

United States Patent [19]
Yoshigai

[11] Patent Number: 5,606,199
[45] Date of Patent: Feb. 25, 1997

[54] RESIN-MOLDED TYPE SEMICONDUCTOR DEVICE WITH TAPE CARRIER CONNECTION BETWEEN CHIP ELECTRODES AND INNER LEADS OF LEAD FRAME

[75] Inventor: Akira Yoshigai, Tokyo, Japan

[73] Assignee: NEC Corporation, Japan

[21] Appl. No.: 539,770

[22] Filed: Oct. 5, 1995

[30] Foreign Application Priority Data

Oct. 6, 1994 [JP] Japan .................................. 6-266070

[51] Int. Cl.⁶ ............................................. H01L 23/495
[52] U.S. Cl. ......................... 257/666; 257/676; 257/692; 257/672
[58] Field of Search ...................... 257/672, 676, 257/788, 666, 787, 692

[56] References Cited

U.S. PATENT DOCUMENTS 4,771,330  9/1988  Long ........................................ 257/672

FOREIGN PATENT DOCUMENTS

| | | |
|---|---|---|
| 3-8352 | 1/1991 | Japan . |
| 3-94435 | 4/1991 | Japan ........................... 257/672 |
| 4-30541 | 2/1992 | Japan . |
| 4-139866 | 5/1992 | Japan ........................... 257/672 |

*Primary Examiner*—William Mintel
*Assistant Examiner*—Roy Potter
*Attorney, Agent, or Firm*—Hayes, Soloway, Hennessey, Grossman & Hage, P.C.

[57] ABSTRACT

The resin-molded type semiconductor device disclosed has a semiconductor chip mounted on an island of a lead frame. The device includes a plurality of first metal foil leads on a tape carrier, which connect electrode pads respectively to inner leads of the lead frame. Among the first metal foil leads, there are a plurality of second metal foil leads which constitute ground wiring, and these second metal foil leads are connected in parallel to the island. For these connections, each of the second metal foil leads has one branch lead, or two branch leads respectively on the inner lead side and on the outer lead side. By forming the ground wiring in this way, it is possible to reduce the parasitic inductance and resistance of the ground circuit.

7 Claims, 7 Drawing Sheets

RESIN-MOLDED TYPE SEMICONDUCTOR DEVICE WITH TAPE CARRIER CONNECTION BETWEEN CHIP ELECTRODES AND INNER LEADS OF LEAD FRAME

BACKGROUND OF THE INVENTION (1) Field of the Invention

The present invention relates to resin-molded type semiconductor devices, and more particularly to a resin-molded type semiconductor device in which electrodes on a semiconductor chip and inner leads of a lead frame are connected to one another through a tape carrier.

(2) Description of the Related Art

In prior art resin-molded type semiconductor devices, electrode pads of a semiconductor chip and inner leads of a lead frame are respectively connected together via thin metal wires. In such systems, when the number of pins is increased and the pitch of the inner leads is reduced, the wires that have already been wired touch the bonding tool, thus making it difficult to obtain highly reliable bonding. Accordingly, in lieu of such systems, it has become increasingly common to use tape carrier bonding.

Figure 1A:
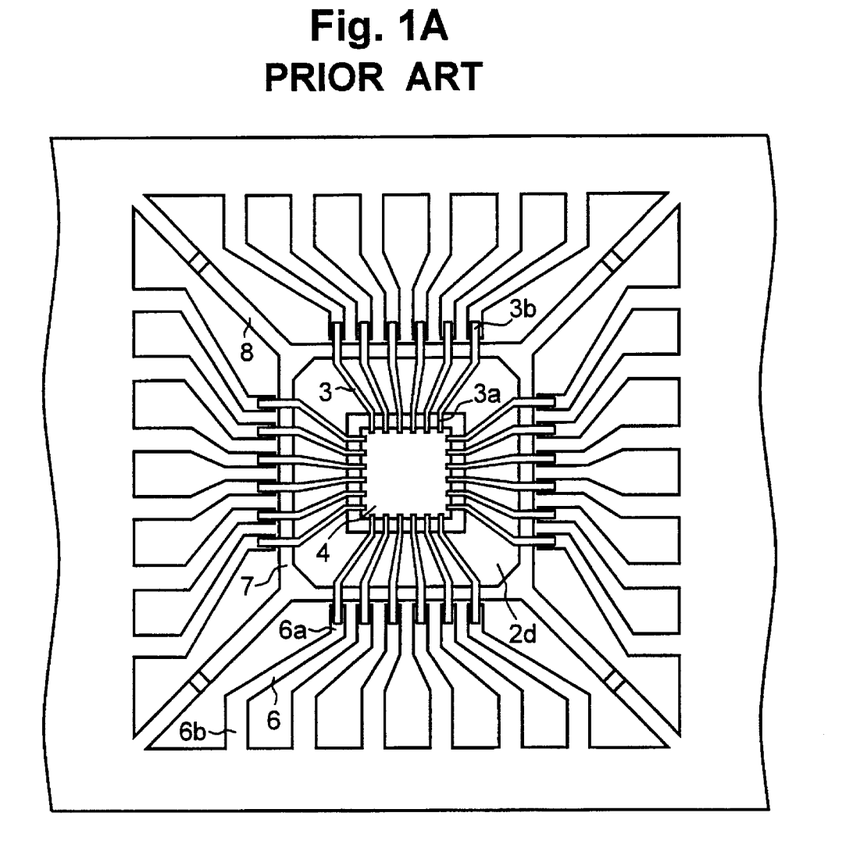
FIGS. 1A and 1B are a plan view and a sectional view, respectively, showing a prior art semiconductor device before and after resin molding, respectively.
Figure 1B:
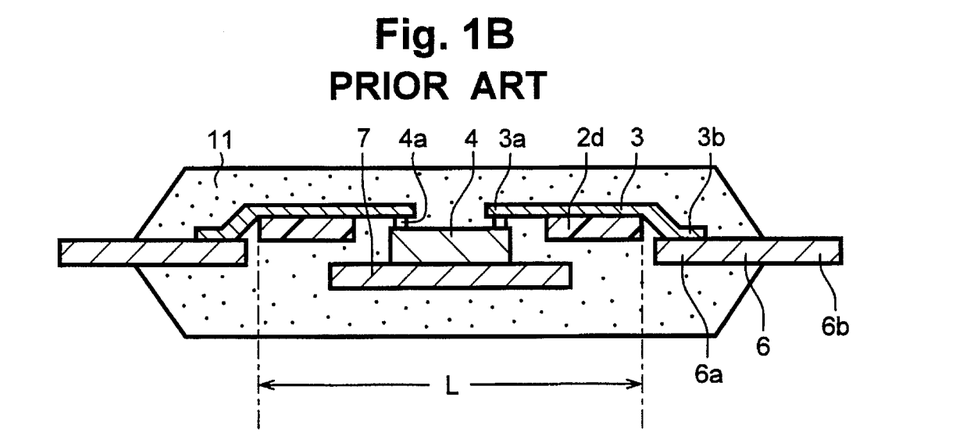

A prior art resin-molded type semiconductor device in which tape carrier type bonding is used is shown in FIGS. 1A and 1B. FIG. 1A shows, in plan view, state of the structure before resin molding, and FIG. 1B shows, in sectional view, state of the same after resin molding.

As shown in FIG. 1A, the prior art resin-molded type semiconductor device of this type uses a lead frame 5 which has a central island 7 as a die pad and LF (lead frame) leads 6 extending from its edges toward the island 7. Each of the LF leads 6 has an inner lead portion 6a and an outer lead portion 6b which extends out from the package after the resin molding. The inner lead portions 6a are arranged such that their ends surround the island 7. The island 7 is supported by four suspending pins 8.

As shown in FIGS. 1A and 1B, a semiconductor chip 4 is secured by conductive paste (not shown) or the like to the island 7. Each electrode pad 4a of the semiconductor chip and a corresponding inner lead portion 6a of the lead frame 5 are connected to each other by a copper foil lead 3 supported by a suspender 2d. Specifically, an inner lead portion 3a of the copper foil lead 3 is connected to the associated electrode pad 4a of the semiconductor chip, and an outer lead portion 3b of the copper foil lead 3 is connected to the associated inner lead portion 6a of the lead frame 5. The whole device is molded by molding resin 11.

This resin-molded type semiconductor device of tape carrier type has advantages in that it allows collective bonding and in that it can accommodate multiple pin packaging. It has a further advantage in that a common lead frame can be used for different chip sizes by making common the tape carrier suspender size, i.e., by making the distance L common between outer lead holes.

In this type of prior art semiconductor device, as shown in FIGS. 1A and 1B, the island is not electrically connected to other parts of the device but is held in a floating state (although it is grounded indirectly in the case where the semiconductor chip has a ground electrode formed on the back surface). It has been proposed to provide the lead frame with a pad section or a stage which is grounded for stabilizing electrical characteristics, as disclosed in, for instance, Japanese Patent Application Kokai Publication No. Hei 3-8352 and Japanese Patent Application Kokai Publication No. Hei 4-30541.

In the former case, ground leads of a tape carrier are connected to the pad section of the lead frame. In the latter case, a frame-like power supply plane or ground plane which surrounds the semiconductor chip is provided so that this and the electrode pads of the semiconductor chip are connected via tape carrier leads. Further, in the latter case it is also described that the back surface of the tape carrier is provided with a ground plane which is connected to front surface leads through vias.

As shown, with the resin-molded type semiconductor device of tape carrier type, the single kind of lead frame that is prepared allows packaging of semiconductor chips of different sizes by varying the tape carrier suspender size. In this case, in order to be adapted to be employed in a greater number of different kinds of semiconductor chips, it is necessary to set the suspender size, i.e., the distance between outer lead holes, to be as great as possible.

This means that for packaging of a semiconductor chip having a comparatively small size, each lead frame inner lead and the corresponding semiconductor chip electrode pad are connected to each other by a long copper foil lead. In recent semiconductor devices, the copper foil lead is made finer in width so as to permit structures having an increased number of pins, and this leads to high parasitic inductance and resistance between each outer lead of the package and the associated electrode pad of the semiconductor chip.

By denoting the parasitic inductance and resistance in a power supply circuit and a ground circuit by L and R, respectively, and a change in current flowing into the integrated circuit by $\Delta I$, a corresponding power supply voltage change $\Delta V$ is given as:

$$\Delta V = L \cdot \Delta I / \Delta t + R \cdot \Delta I$$

In recent semiconductor integrated circuits, the number of transistors that are switched at a time is on an increasing trend due to scale and versatility increases of the circuits. This means that the current change $\Delta I$ is on an increasing trend and becoming sharper due to operation speed increases.

Therefore, when there are high parasitic inductance and resistance in the power supply circuit and the ground circuit, the power supply voltage change $\Delta V$ is increased thereby increasing the possibility of erroneous operation in the integrated circuit.

This drawback may be precluded by reducing the inductances and resistances in the power supply circuit and the ground circuit. Doing this, however, is difficult in the prior art semiconductor device because of the copper foil lead trend of becoming finer and longer as described above.

The Japanese Patent Application Kokai Publication No. Hei 3-8352 and the Japanese Patent Application Kokai Publication No. Hei 4-30541 show the connection of a portion of tape carrier copper foil lead to a pad section (i.e., ground conductor) or to a plane for power supply (or ground). By so doing, however, the inductance or resistance cannot be reduced. In the case of using a tape carrier with a ground plane as shown in the Japanese Patent Application Kokai Publication No. Hei 4-30541, it is possible to reduce the inductance and resistance of the ground circuit. However, use of a double side tape carrier requires through-hole plating, and the tape carrier is inevitably expensive. Besides, the inductance and resistance cannot be reduced greatly using this technique.

SUMMARY OF THE INVENTION

The invention seeks to solve the above problems. Specifically, an object of the invention is to reduce the inductances and resistance in the power supply circuit and the ground circuit of a tape carrier system resin-molded type semiconductor device, thereby suppressing power supply voltage variations due to current changes to prevent erroneous operation of the integrated circuit and ultimately stabilizing the operation of the circuit.

To attain the above object of the invention, there is provided a resin-molded type semiconductor device which comprises a semiconductor chip mounted on an island of a lead frame and having electrode pads each connected to each associated inner lead of the lead frame via a metal foil lead of a tape carrier, the whole device being resin-molded, wherein the metal foil leads of ground wiring are connected to the island on their inner lead side and outer lead side.

According to the invention, each of the metal foil leads for ground wiring of the tape carrier has its inner and outer lead sections connected to the island. Thus, in the construction of the electric circuit, the metal foil leads are connected in parallel with the island. Since the island is a conductor having low inductance and low resistance, it can reduce the inductance and resistance of the ground circuit. Thus, the parasitic inductance and resistance of the ground circuit are reduced so as to suppress power supply voltage variations with current variations.

PREFERRED EMBODIMENTS OF THE INVENTION

Preferred embodiments of the invention will now be described.

First Embodiment

Figure 2:
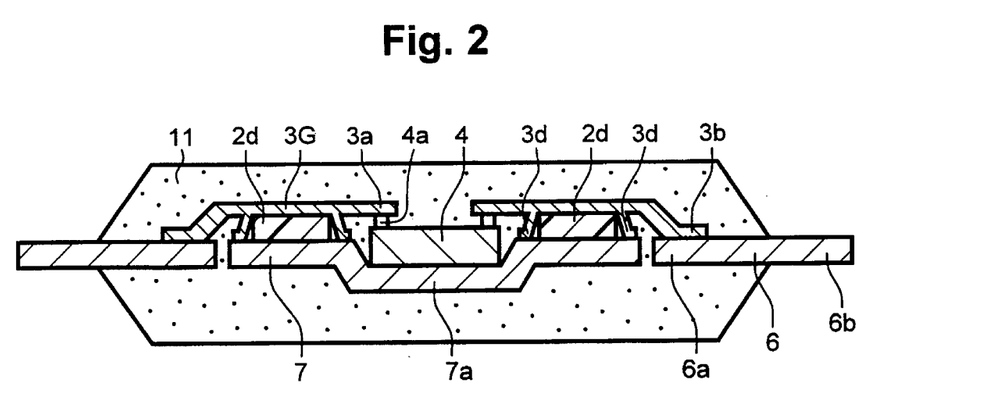
FIG. 2 is a sectional view showing a semiconductor device, after resin molding, of a first embodiment according to the invention.

FIG. 2 is a sectional view showing a first embodiment of the invention. As shown therein, each of the ground leads 3G of the tape carrier which connect electrode pads 4a of a semiconductor chip 4 and inner lead sections 6a of the corresponding LF leads 6, has two branch leads 3d which are connected to different portions of an island 7 of the lead frame.

The island 7 has a central recess 7a as a chip support section, in which the semiconductor chip 4 is mounted. With the recess 7a formed in the island 7, a suspender 2d of the tape carrier can be disposed in close contact with the island 7. In addition, it is possible to connect the electrode pads 4a and the inner lead sections 3a of the copper foil lead with the copper foil lead held in a horizontal state.

The lead frame (6, 7), the semiconductor chip 4 and the tape carrier (2d, 3G) are molded with molding resin 11 except for the outer lead sections 6b of the LF lead 6.

Now, a method of manufacturing the first embodiment of the resin-molded type semiconductor device according to the invention will be described with reference to FIGS. 3A, 3B and 4.

Figure 3A:
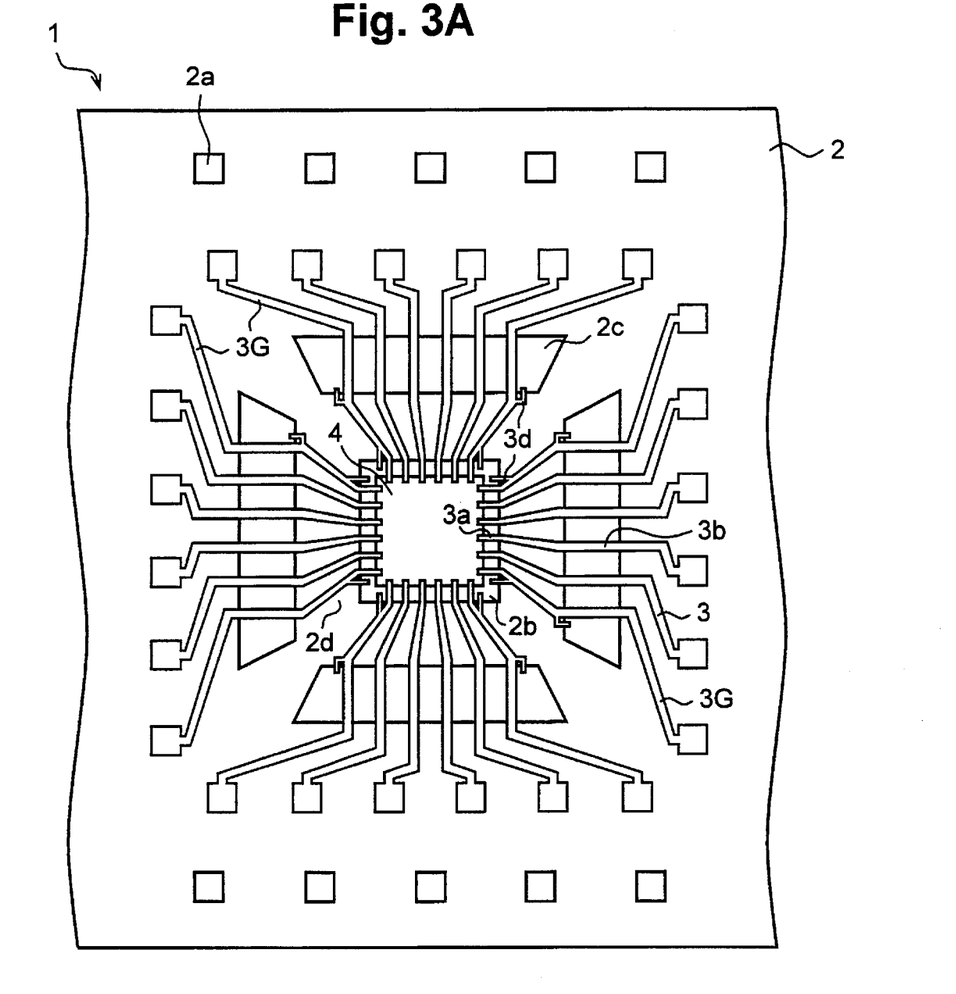
FIGS. 3A and 3B are a plan view and a sectional view, respectively, for describing a method of manufacturing the first embodiment according to the invention.
Figure 3B:
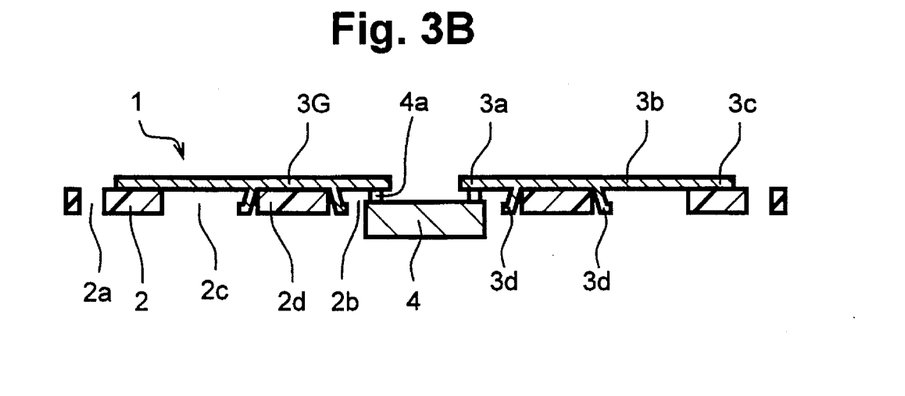

First, as shown in FIGS. 3A and 3B, the semiconductor chip 4 is bonded to the tape carrier 1. The tape carrier 1 includes a base film 2 and copper foil leads 3 supported thereon. Among the copper foil leads 3 those at the corners are used as ground leads 3G for ground wiring.

The base film 2 has sprocket holes 2a for its transport and positioning, a device hole 2b for disposing the semiconductor chip 4 therein, and outer lead holes 2c. A base film portion that exists between the device holes 2b and outer lead holes 2c is used as the suspender 2d.

Each of the copper foil leads 3 has an inner lead section 3a extending into the device hole, an outer lead section 3b crossing each outer lead hole 2c and a test pad 3c for testing and measurement. Each of the ground leads 3G has one or two branch leads 3d.

The semiconductor chip 4 is disposed in the device hole 2b, and its electrode pads 4a are connected by a thermal press process or an eutectic process to the inner lead sections 3a of the copper foil leads 3.

As for the tape carrier 1, after the bonding of the semiconductor chip 4 to it and before its bonding to the lead frame, the base film 2 is cut along a line connecting the inner ends of the outer lead holes 2c, and the copper foil leads 3 are cut in the outer lead sections 3b.

Figure 4:
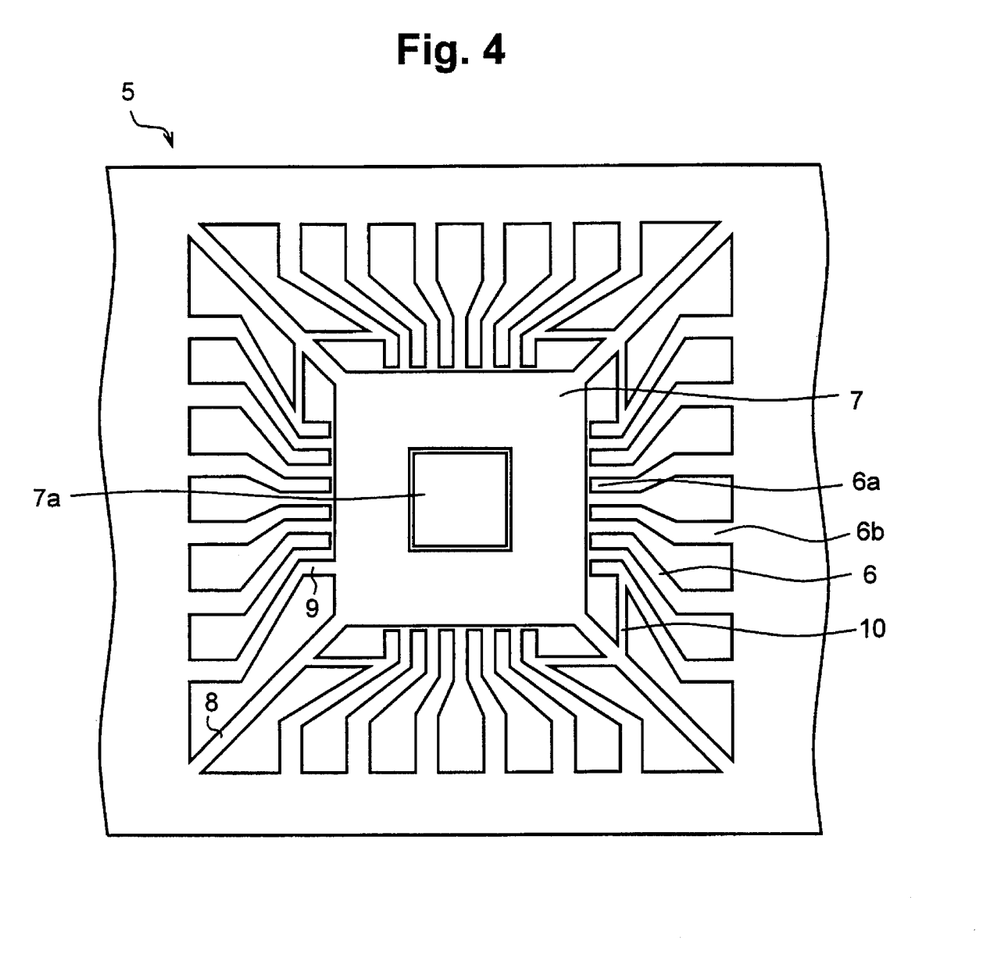
FIG. 4 is a plan view showing a lead frame used in the first embodiment according to the invention.

FIG. 4 is a plan view showing the lead frame 5, on which the tape carrier with the semiconductor chip is mounted.

As shown in FIG. 4, the lead frame 5 has a central island 7 suspended by four suspending pins 8 and LF leads 6 extending from its edges toward the island 7. Each of the LF leads 6 has an inner lead section 6a on the side of the island and an outer lead section 6b on the opposite side. Of the LF leads 6, each of those used as ground leads is connected by suspending pin connectors 10 to the island 7 via suspending pins 8, or connected directly by an island connector 9 to the island 7. The island 7 has a central recess 7a for mounting the semiconductor chip therein.

Figure 5A:
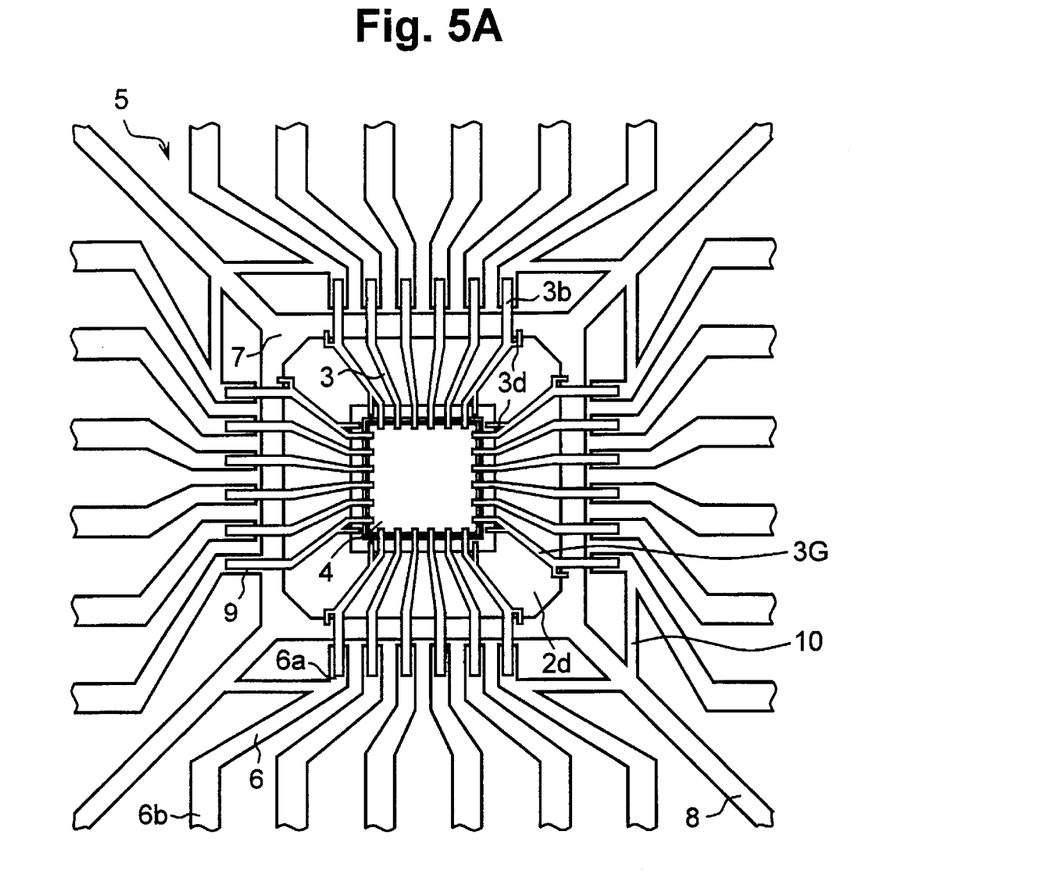
FIGS. 5A and 5B are a plan view and a sectional view, respectively, showing a semiconductor device, before resin molding, of the first embodiment according to the invention.
Figure 5B:
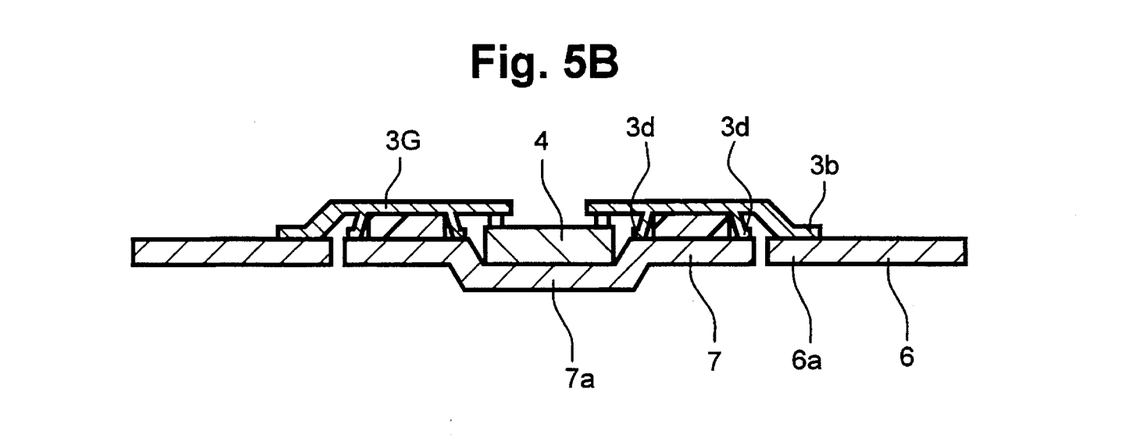

Subsequently, the tape carrier with the semiconductor chip is bonded to the lead frame. FIGS. 5A and 5B show a plan view and a sectional view of the system after the bonding of the tape carrier. The semiconductor chip 4 is mounted by conductive paste (not shown) or the like in the recess 7a of the island 7, and the outer lead sections 3b of the copper foil leads 3 are collectively bonded by a thermal press process to the inner lead sections 6a of the LF leads 6. Afterwards, the branch leads 3a of some of the copper foil leads 3 are soldered to the island 7. Alternatively, the branch leads may be bonded by using a single point bonding process which is recently being used for the bonding between a copper foil lead inner lead section and a semiconductor chip bump electrode. Finally, the system is molded with molding resin 11 by using a transfer molding process. Thus, the semiconductor device as shown in FIG. 2 is obtained.

With the semiconductor device formed in this way, it is possible to reduce the parasitic inductance between the lead frame outer lead section and the semiconductor chip electrode pad from a value of about 12 nH as in a prior art example to about 1.7 nH. Also, it is possible to reduce the parasitic resistance from 200 mΩ down to 12 mΩ. The capacitance, however, was increased although slightly from 0.07 pF to 0.1 pF because of a copper foil lead area increase.

Second Embodiment

Figure 6A:
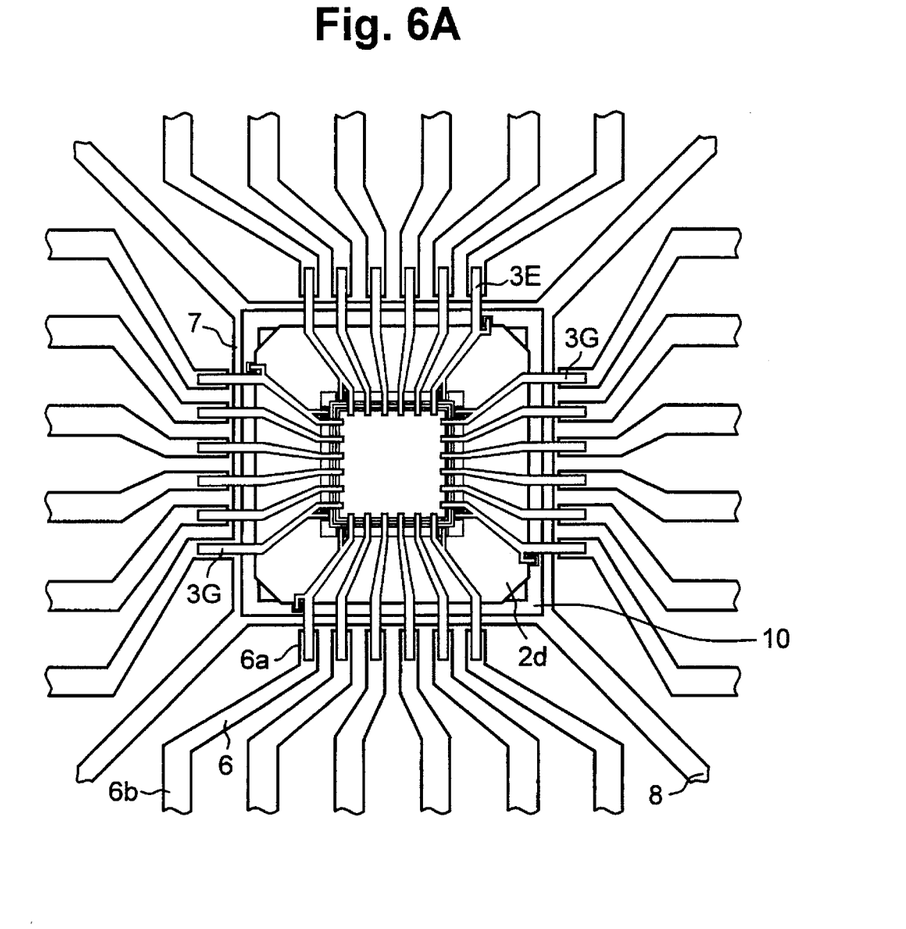
FIGS. 6A and 6B are a plan view and a sectional view, respectively, showing a semiconductor device, before and after resin molding, of a second embodiment according to the invention.
Figure 6B:
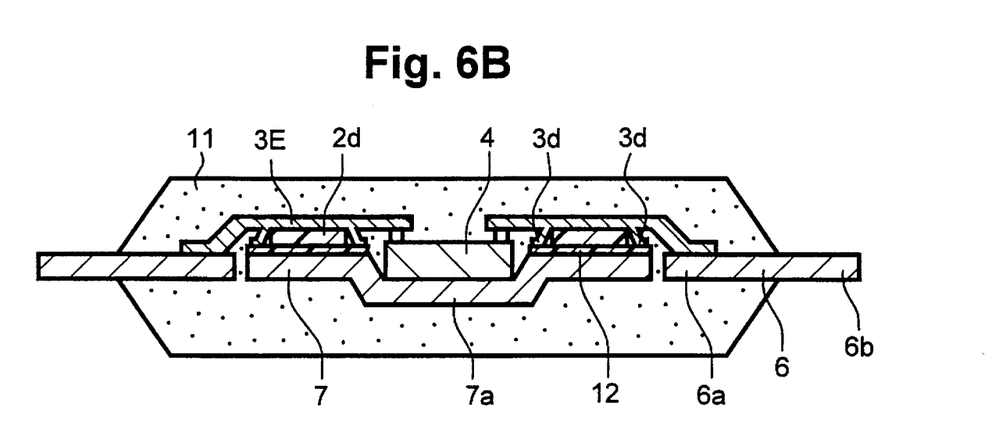

A second embodiment of the invention will now be described with reference to FIGS. 6A, 6B, 7A and 7B. FIG. 6A is a plan view showing the second embodiment of the invention before resin molding. FIG. 6B is a sectional view showing the embodiment after resin molding. In FIGS. 6A and 6B, parts like those in FIGS. 2, 5A and 5B showing the previous embodiment are designated by like reference numerals and symbols, and overlap description is omitted.

While in the previous first embodiment the sole ground leads among the copper foil leads are connected to the island, in this embodiment a composite lead frame is used, which has a multi-layer substrate having a ground plane layer and a power supply plane layer, the multi-layer substrate being set on the island with the ground plane layer connected thereto. Thus, inductance reduction is intended not only with respect to the ground leads but also to the power supply leads.

Figure 7A:
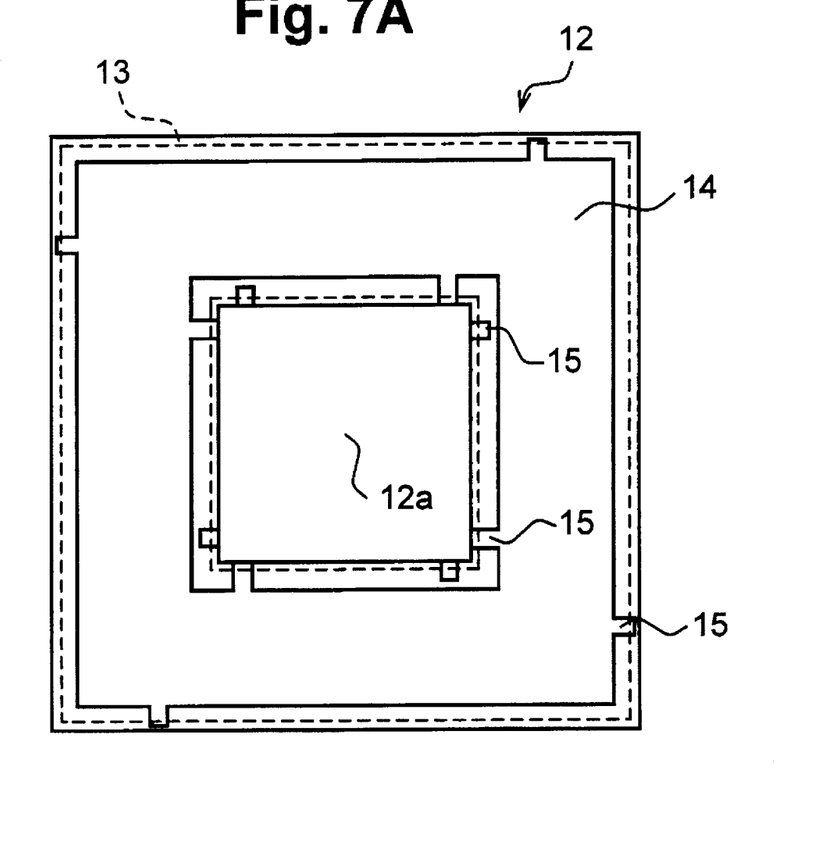
FIGS. 7A and 7B are a plan view and a sectional view, respectively, showing a multi-layer substrate used in the second embodiment of the invention.
Figure 7B:
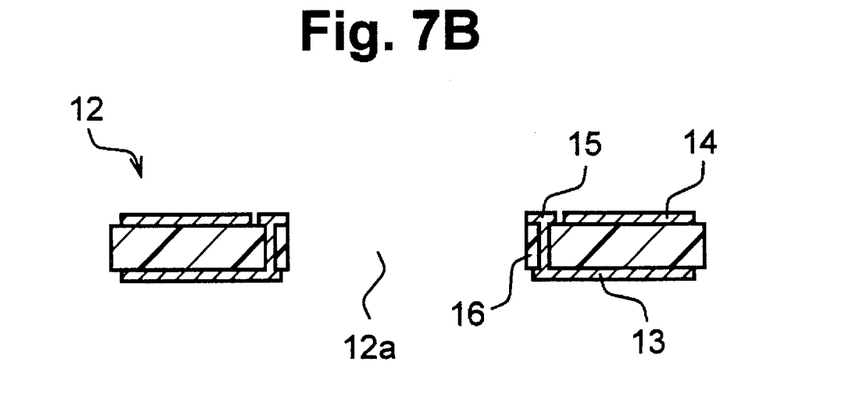

FIGS. 7A and 7B are respectively a plan view and a sectional view showing the multi-layer substrate set on the island in this embodiment. As shown, the multi-layer substrate 12 has a central device hole 12a, which is smaller than the tape carrier device hole 2b but greater than the semiconductor chip 4 that is mounted. The substrate 12 has a ground plane layer 13 formed on substantially the entire area of its back surface and a power supply plane layer 14 formed on substantially the entire area of its front surface.

The ground plane layer 13 is led via through holes 16 to the front surface of the substrate and connected to connecting pads 15 which are formed along the edge of the device hole 12a. The power supply plane layer 14 is connected to connecting pads 15 formed adjacent the outer edge of the substrate and also along the edge of the device hole 12a.

Referring back to FIGS. 6A and 6B, the multi-layer substrate shown in FIGS. 7A and 7B is mounted on the island 7 with the ground plane layer 13 connected to the island. Among the copper foil leads 3 of the tape carrier, each of the ground leads 3G has its inner lead section formed with branch leads 3d which are connected to the connecting pads 15 for grounding the multi-layer substrate 12. Each of the power supply leads 3E of the tape carrier has its inner and outer lead sections formed with branch leads 3d, and connected to the power supply plane layer 14 of the multi-layer substrate 12 by the branch leads 3d.

As shown by the above embodiment, according to the invention it is possible to provide a resin-molded type semiconductor device, which permits reduction in the parasitic inductance and resistance not only of the ground circuit but also of the power supply system circuit, and is subject to less power supply voltage variations even in the case when a semiconductor chip with higher speed semiconductor elements is mounted.

While the second embodiment uses a multi-layer substrate with two conductive layers, in the case when the semiconductor chip uses a power supply circuit having two power supplies, it is possible to use as the multi-layer substrate a three-layer substrate having a first power supply plane layer and a second power supply plane layer in addition to the ground plane layer to suppress voltage variations of the individual power supplies.

As has been described in the foregoing, in the resin-molded type semiconductor device of tape carrier type according to the invention, the ground leads among the copper foil leads of the tape carrier are connected in parallel with the lead frame island. Thus, even when the copper foil leads are long and thin, it is possible to maintain low parasitic inductance and resistance of the ground circuit. Thus, according to the invention it is possible to reduce power supply voltage variations resulting from sudden power supply current changes.

Further, with the embodiment of the invention using a composite lead frame with the multi-layer substrate having a power supply plane and mounted on the island, it is possible to reduce the parasitic inductance and resistance of the power supply circuit, and thus it is possible to further suppress power supply voltage variations and to use this embodiment with higher speed semiconductor integrated circuits.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A resin-molded type semiconductor device having a semiconductor chip and a tape carrier including a base film, said device comprising:

an island which is formed of a lead frame and which is attached to an undersurface of said base film;

a plurality of metal foil leads on said tape carrier, which connect electrode pads respectively to inner leads of the lead frame; and a plurality of ground leads which are constituted by parts of said metal foil leads, said ground leads being connected at least at inner lead sides of said ground leads to said island.

2. The resin-molded type semiconductor device according to claim 1, in which each of said ground leads has a first branch lead and a second branch lead respectively on the inner lead side and on an outer lead side, said first and second branch leads connecting said ground leads to said island.

3. The resin-molded type semiconductor device according to claim 1, in which said island has a central recess for mounting said semiconductor chip therein.

4. The resin-molded type semiconductor device according to claim 1, in which said lead frame includes a grounding lead pin directly connected to said island.

5. The resin-molded type semiconductor device according to claim 1, in which said lead frame includes a grounding lead pin connected to said island through a suspending pin.

6. The resin-molded type semiconductor device according to claim 1, further comprising power supply leads and wherein said lead frame is a composite lead frame having a multi-layer substrate having at least two conductive layers and being mounted on said island, said power supply leads being connected to a power supply conductive layer of said multi-layer substrate on inner lead and outer lead sides of said power supply leads.

7. The resin-molded type semiconductor device according to claim 6, in which each of said power supply metal leads has branch leads respectively at the inner lead side and the outer lead side and is connected to said power supply conductive layer via said branch leads.

\* \* \* \* \*